US 6,750,796 B1

(12) United States Patent
Holloway et al.

(10) Patent No.: US 6,750,796 B1
(45) Date of Patent: Jun. 15, 2004

(54) LOW NOISE CORRELATED DOUBLE SAMPLING MODULATION SYSTEM

(75) Inventors: Peter R. Holloway, Groveland, MA (US); Eric D. Blom, Wakefield, MA (US); Jun Wan, Haverhill, MA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/401,835

(22) Filed: Mar. 27, 2003

(51) Int. Cl.$^7$ ............................ H03M 3/00; H01L 35/00
(52) U.S. Cl. ........................ 341/143; 341/155; 341/166; 341/118; 327/512; 327/337; 327/75; 327/538
(58) Field of Search ................................ 341/155, 143, 341/122, 166, 118; 327/512, 337

(56) References Cited

U.S. PATENT DOCUMENTS

| | | | |
|---|---|---|---|
| 4,939,516 A | 7/1990 | Early | 341/143 |
| 5,159,341 A | * 10/1992 | McCartney et al. | 341/143 |
| 5,461,381 A | * 10/1995 | Seaberg | 341/143 |
| 5,675,334 A | * 10/1997 | McCartney | 341/118 |
| 5,691,720 A | * 11/1997 | Wang et al. | 341/143 |
| 5,841,310 A | 11/1998 | Kalthoff et al. | 327/337 |
| 5,870,048 A | * 2/1999 | Kuo et al. | 341/143 |
| 5,936,433 A | 8/1999 | Holloway | 327/75 |
| 5,982,221 A | 11/1999 | Tuthill | 327/512 |
| 5,982,315 A | * 11/1999 | Bazarjani et al. | 341/143 |
| 6,008,685 A | 12/1999 | Kunst | 327/512 |
| 6,028,472 A | 2/2000 | Nagumo | 327/512 |
| 6,037,887 A | * 3/2000 | Wu et al. | 341/143 |
| 6,064,054 A | 5/2000 | Waczynski et al. | 250/214 R |
| 6,147,550 A | * 11/2000 | Holloway | 327/538 |
| 6,147,631 A | 11/2000 | Maulik et al. | 341/122 |
| 6,160,393 A | 12/2000 | Ahn et al. | |
| 6,242,974 B1 | 6/2001 | Kunst | 330/9 |
| 6,411,242 B1 | 6/2002 | Oprescu et al. | 341/155 |

FOREIGN PATENT DOCUMENTS

GB 2031193 A 4/1980

OTHER PUBLICATIONS

Jacques Robert et al., "A 16–Bit Low–Voltage CMOS A/D Converter", IEEE Journal of Solid–State Circuits, vol. SC–22, No. 2, Apr. 1987, pp. 157–163.

* cited by examiner

Primary Examiner—Michael Tokar
Assistant Examiner—Lam Mai
(74) Attorney, Agent, or Firm—Patent Law Group LLP; Carmen C. Cook (57) ABSTRACT

A charge balancing modulation system for digitizing the output of a variable impedance sensor utilizes synchronous excitation of the input sensor and AC coupling of the analog input signal. The modulation system also implements correlated double sampling to provide low noise and highly accurate analog-to-digital conversions. In one embodiment, the modulation system includes an excitation source for providing a switched current to the input sensor and generating an input voltage step in response, and an integrator including an input capacitor, an amplifier and an accumulation capacitor. The input capacitor AC couples the analog input signal to the integrator. The integrator is controlled by switches operating in complementary state for enabling correlated double sampling operation or enabling data dependent charge accumulation operation. The modulation system generates an output data stream exhibiting a ones density proportional to the magnitude of the average input voltage step.

43 Claims, 4 Drawing Sheets

LOW NOISE CORRELATED DOUBLE SAMPLING MODULATION SYSTEM

CROSS-REFERENCE TO RELATED APPLICATIONS

This application is related to the following concurrently filed and commonly assigned U.S. patent applications: U.S. patent application Ser. No. 10/402,658, entitled "Digitizing Temperature Measurement System," of Peter R. Holloway et al.; U.S. patent application Ser. No. 10/402,447, entitled "Constant Temperature Coefficient Self-Regulating CMOS Current Source," of Peter R. Holloway et al.; and U.S. patent application Ser. No. 10/402,080, entitled "A Constant RON Switch Circuit with Low Distortion and Reduction of Pedestal Errors," of Peter R. Holloway. The aforementioned patent applications are incorporated herein by reference in their entireties.

FIELD OF THE INVENTION

The invention relates to a modulation system for variable impedance sensor analog to digital conversion applications. In particular, the invention relates to an AC coupled, low noise modulation system which implements correlated double sampling.

DETAILED DESCRIPTION OF THE PREFERRED EMBODIMENTS

In accordance with the principles of the present invention, a charge balancing modulation system utilizes synchronous, continuous time switching of an excitation source and AC coupling to sample and digitize an analog input signal. The modulation system also implements correlated double sampling to reduce noise and increase the precision of analog-to-digital conversions. The modulation system of the present invention can be incorporated into an analog-to-digital converter (ADC) for digitizing analog input signals generated by an impedance varying sensor, such as a varying-resistance sensor or a silicon diode temperature sensor, where the sensor's response to the intended stimulus corresponds to a change in the resistive or the "real" portion of the sensor's impedance.

In accordance with the present invention, a modulation system incorporates a synchronous excitation source for exciting a sensor and a modulator for sampling and digitizing the analog input signals generated by the sensor. The modulation system of the present invention realizes synchronous detection by performing sensor excitation phase-locked to the sampling function of the modulator. In an alternate embodiment, the modulator of the modulation system can be operated as a stand alone modulator receiving analog input signals from an excitation source driving a sensor. In that case, synchronous detection can be realized by synchronizing the operation of the excitation source with the operation of the modulator using known synchronization schemes, such as a phaselocked loop.

According to one aspect of the present invention, the modulation system can be incorporated in an incremental or a delta-sigma ADC for sampling and digitizing analog signals generated at an impedance-varying input sensor in response to its stimulus. In general, both a delta-sigma ADC and an incremental ADC include a delta-sigma ($\Delta\Sigma$) modulator as the analog front end and digital post processing circuitry as the digital back end. The modulator samples the analog input signal, such as an input voltage generated by the input sensor, and generates a single bit digitized data stream having an ones density representative of the magnitude of the analog input signal. The digital post processing circuitry of a delta-sigma ADC may include filters, while the digital post processing circuitry of an incremental ADC may include counters, each for processing the ones density data stream. Each post processing circuit thereby generates a single digital value indicative of the relative frequency of occurrence of the many logical "1" values in the digitized data stream within some time interval. The single digital value is therefore an estimate of the average magnitude of the analog input signal during that time interval.

Modulation System Overview

Figure 1:
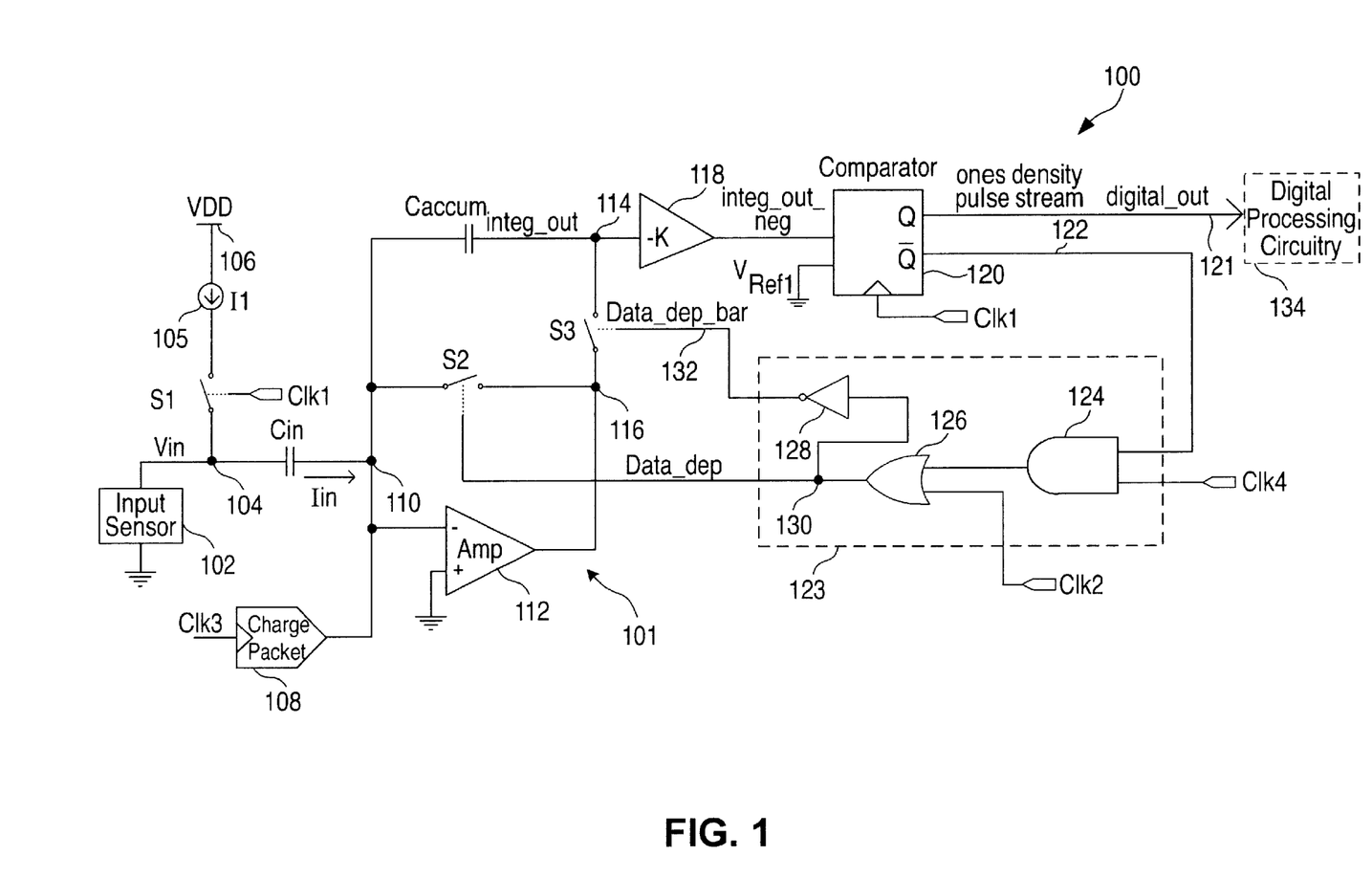
FIG. 1 is a schematic diagram of a charge balancing modulation system according to one embodiment of the present invention.

FIG. 1 is a schematic diagram of a charge balancing modulation system according to one embodiment of the present invention. Referring to FIG. 1, modulation system 100 is configured to sample and digitize an analog input signal generated across an input sensor 102. In the present illustration, the analog input signal is an input voltage step Vin coupled to an input node 104 of the modulation system.

In the present description, sensors or input sensors are defined as circuit elements which exhibit some observable, measurable change in their electrical characteristics in response to the stimulus to be measured. The modulation system of the present invention is designed for use in measuring and digitizing the output signal of a sensor which exhibits a change in the resistive or the real portion of its impedance in response to its sensed stimulus. That is, the modulation system of the present invention can be operated with many different types of impedance varying sensors. Examples of sensors that vary the real part of their impedance in response to external stimulus include resistive thermal devices, thermistors, silicon diode temperature sensors, piezoresistive pressure sensors and resistive displacement sensors. As is well understood by one skilled in the art, impedance Z can be expressed in rectangular form as Z=R+jX where R denotes the resistive component and X denotes the reactive component of the impedance. Thus, in the present description, the "resistive" or "real" portion of an impedance refers to the resistive component "R" of the impedance as expressed in the equation above.

Modulation system 100 of the present invention employs synchronous excitation of the input sensor element. Thus, input voltage step Vin is generated and sampled at predetermined, fixed time intervals. In the present embodiment, synchronous excitation of the input sensor element is realized by the continuous time switching of an excitation current I1 at the input voltage node. Referring to FIG. 1, synchronous excitation of input sensor 102 is effectuated by switching current I1, provided by a current source 105, through the action of a switch S1 controlled by a clock signal Clk1.

As mentioned above, the modulation system of the present invention can be applied to sample and digitize a variety of analog signal sources. Thus, input sensor 102 represents a sensing element suitable for the parameter being measured. The implementation of the switching excitation source of modulation system 100 may differ depending on the parameters being measured, as will be described in more detail below. The switching excitation current circuit of FIG. 1 is illustrative only and is not intended to be limiting. For instance, depending on the applications, the switching excitation current circuit can implement an excitation current that changes from zero current to a positive current value. In other embodiments, the switching excitation current circuit can implement an excitation current that changes from a first current value to a second, higher current value. In yet another embodiment, the excitation source may be an excitation voltage circuit providing a first voltage value and a second higher voltage value.

Modulation system 100 includes an integrator 101 for receiving input voltage step Vin on node 104 and integrating the charge associated with the step change in voltage Vin. In the present embodiment, integrator 101 of modulation system 100 is formed by an input capacitor Cin, an operational amplifier 112 and an accumulation capacitor Caccum. Input capacitor Cin is coupled between input node 104 and a node 110 which is the inverting input terminal of amplifier 112. The non-inverting input terminal of amplifier 112 is connected to the ground potential. A switch S2, controlled by a data dependent (Data_dep) signal, is connected between the inverting input terminal (node 110) and the output terminal (node 116) of amplifier 112. When switch S2 is closed, a short-circuited negative feedback loop is formed around amplifier 112 and integrator 101 is in an inactive mode.

Accumulation capacitor Caccum is switchably connected across amplifier 112. Specifically, one plate (or terminal) of capacitor Caccum is connected to the inverting input terminal (node 110) of amplifier 112 while the other plate of capacitor Caccum is connected to the output terminal (node 116) of amplifier 112 through a switch S3. Switch S3 is controlled by the inverse of the data dependent signal (Data_dep_bar). When switch S3 is closed, capacitor Caccum is connected in the negative feedback loop of amplifier 112 and integrator 101 is in an active mode. When switch S3 is open, capacitor Caccum is disconnected from amplifier 112 and integrator 101 is in an inactive mode whereby the voltage across and the charge stored on capacitor Caccum are not affected by the operation of amplifier 112. As will become apparent in the description below, switch S2 and switch S3, controlled by Data_dep signal and its inverse respectively, operate in a complementary fashion (one switch closes while another opens) such that integrator 101 is either active (amplifier 112 connected to capacitor Caccum by action of switch S3) or inactive (amplifier 112 shorted by action of switch S2).

Modulation system 100 is an AC coupled system such that only changes in the input voltage Vin are measured and coupled to the integrator. In operation, input voltage Vin changes in response to the application of switched current I1 through the switching action of switch S1. Capacitor Cin couples the voltage change in voltage Vin (ΔVin) to the inverting input terminal (node 110) of amplifier 112. Specifically, the input signal to the modulation system is a current Iin consisting of discrete packets of charge associated with voltage changes at voltage Vin. In the present embodiment, the input charge packets are associated with the positive voltage steps at voltage Vin that occur at a rate of one charge packet per sampling cycle. The positive-going-voltage-step charge packet is to be balanced out with a negative-going-voltage-step reference charge packet, as will be explained in more detail below. In other embodiments, the input charge packets can be generated based on the negative-going voltage steps of voltage Vin, as long as the polarity of the reference charge packet is modified accordingly.

The manner in which a discrete charge packet is produced by the application of the stepped excitation current I1 and by the AC coupling of the resultant analog input signal through input capacitor Cin is described as follows. For an ideal voltage step from any DC voltage V1 to a larger DC voltage V2 generated by a voltage source of output impedance R, a current flowing into a capacitor Cin is given by:

$$i(t) = \frac{\Delta V}{R} e^{\frac{-t}{RCin}},$$

where ΔV is (V2−V1) and Cin represents the capacitance of input capacitor Cin. The charge transferred through capacitor Cin is given by:

$$q(t) = C_{in}\Delta V(1 - e^{-t/RCin}).$$

If the input voltage step is allowed to persist for a time much, much longer than the time constant RCin, then the input current decays to very nearly zero and the charge transfer settles such that almost all the charge is transferred through capacitor Cin. The transferred charge is given by:

$$Q_{in} = C_{in}\Delta V,$$

where the charge Qin is transferred through Cin to ground. In modulation system 100, the charge Qin is transferred through Cin to node 110 which is a virtual ground node of amplifier 112. In the case where a negative-going voltage step is involved, that is, a voltage step from a DC voltage V1 to a smaller DC voltage V2, a negative charge packet of magnitude −Qin will be defined in the same manner as described above.

In modulation system 100, either the positive-going transition or the negative-going transition of the input signal, but not both, is used as the input signal to the modulator. While it might be possible in some circumstances to implement an input excitation source which only generates a positive or a negative voltage/current step at the input sensor, a more useful excitation source produces a repetitive flat topped pulse which returns to a lower value between each positive step. As will be described in detail below, in a preferred embodiment of the present invention, the excitation source generates at the input sensor a repetitive flat topped pulse between a first voltage level and a second higher voltage level which is the input waveform. The positive-going voltage steps of the input voltage pulses are used to drive the AC coupling input capacitor to generate the input charge packets.

In modulation system 100, it is possible to use a repetitive pulse excitation source to generate the input charge packets because the modulator is operated to integrate only charge packets from the positive-going voltage steps and ignore the charge packets from the negative-going voltage steps. Specifically, the accumulation capacitor Caccum is disconnected from amplifier 112 during the negative-going transition of the input voltage pulse. Therefore, the negative charge is not accumulated but instead is dissipated by the amplifier output circuits. Thus, because the circuit ignores the charge transferred during the negative transition of the input pulse, modulation system 100 is able to use an easily generated repetitive pulse as the input excitation source. In alternate embodiments, the negative going transition can be used to generate the input charge packet and the positive going transition of the input pulse from the excitation source can be accordingly ignored.

A charge transfer of magnitude Qin which repetitively occurs at a sampling cycle period T defines an input current given by:

$$I_{in} = \frac{Q_{in}}{T} = \frac{C_{in}\Delta V}{T}.$$

In the following descriptions, it is assumed that the flat portions of input voltage Vin at input capacitor Cin are of sufficiently long time interval and the clock frequency of the excitation source is low enough that the approximation that Qin=Cin$\Delta$V produces insignificant errors. The magnitude of charge Qin derived by the AC coupling of the step input voltage is a function of the capacitance of input capacitor Cin and the magnitude of the voltage change at input voltage Vin. More importantly, the magnitude of the charge Qin is independent of the DC voltage level at Vin.

By virtue of using AC coupling of the input voltage, the DC voltage level of input voltage Vin is irrelevant to the operation of the modulation system. Therefore, the modulation system of the present invention can be advantageously applied to measure small synchronous $\Delta$Vin amplitudes even when superimposed upon a large DC common mode voltage. For example, the modulation system of the present invention can be used to measure step voltage amplitudes as small as 10 micro-volts superimposed upon a common mode DC baseline voltage as large as 1000 volts. This type of precision measurement cannot be easily achieved by conventional DC coupled modulation systems. In a DC coupled modulation system, a large DC voltage at the input terminal can saturate the input range of the amplifier and clip the output response of the amplifier. As a result, a small amplitude $\Delta$Vin in the presence of a large baseline voltage cannot be measured in the conventional DC coupled systems without the use of additional input AC coupling circuitry.

Based on the control of clock signals Clk1 and Clk2, integrator 101 uses gated continuous time integration to accumulate charge from the input voltage step. The use of gated continuous time integration has the effect of bandlimiting any wideband noise applied to the analog input terminal of integrator 101 or generated by the reference charge packet circuit (circuit 108 to be described below). Thus, the modulation system of the present invention is capable of achieving enhanced noise reduction as compared to conventional systems using switched capacitors to sample voltage and then accumulate charge at the analog input terminal.

To implement charge balancing in modulation system 100, integrator 101 receives a periodic, non-data dependent reference charge packet from a charge packet generator circuit 108 which reference charge packet is used, in a data dependant manner, to balance the charge accumulated from input voltage step Vin. A clock signal Clk3 controls the frequency of the application of the reference charge packet to the inverting input terminal (node 110) of amplifier 112.

Figure 2:
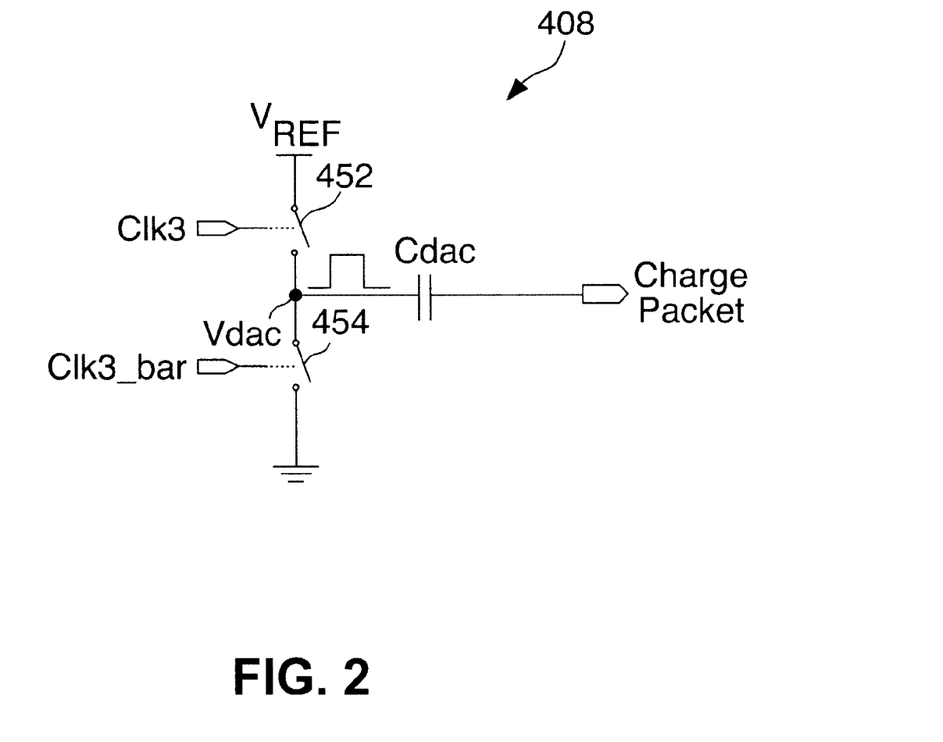
FIG. 2 illustrates one exemplary embodiment of a charge packet generator circuit which can be used to practice the modulation system of the present invention.

Charge packet generator circuit 108 can be implemented using any means, conventional or to be developed, for generating a given amount of charge within a given time period. Typically, a voltage pulse Vdac coupled to a capacitor is used to generate a reference charge packet. FIG. 2 illustrates one exemplary embodiment of a charge packet generator circuit which can be used to practice the modulation system of the present invention. Referring to FIG. 2, charge packet generator circuit 408 includes a pair of serially connected switches 452 and 454 connected between a reference voltage $V_{REF}$ and the ground potential. Switches 452 and 454 are controlled by complementary clock signals Clk3 and Clk3_bar, respectively. Thus, one switch is open while the other is closed. The common node between switches 452 and 454, having a voltage Vdac, is coupled to a capacitor Cdac. In operation, due to the complementary switching action of switches 452 and 454, voltage Vdac swings from the ground potential to voltage $V_{REF}$ and vice versa at the clock frequency of Clk3. Voltage Vdac charges the left plate of capacitor Cdac and a charge packet, proportional to voltage $V_{REF}$, is accordingly generated at the right plate of capacitor Cdac.

Returning to FIG. 1, the output voltage integ_out of integrator 101 (at node 114) is coupled to an inverting gain buffer 118. Buffer 118 is used to present a high impedance input to capacitor Caccum such that no loading is placed on capacitor Caccum. In the present embodiment, buffer 118 has a gain of −K. Thus, the output voltage integ_out_neg from buffer 118 is equal to −K times the input voltage integ_out. In one embodiment, buffer 118 can have a gain of −1 whereby the buffer operates to merely invert the voltage polarity of the input voltage.

After buffer 118, the voltage integ_out_neg is coupled to a comparator 120 comparing the voltage integ_out_neg with a reference voltage $V_{Ref1}$. If the integ_out_neg value is greater than $V_{Ref1}$, comparator 120 generates a logical "1" as the output signal. If the integ_out_neg value is less then $V_{Ref1}$, comparator 120 generates a logical "0" as the output signal. Comparator 120 is controlled by clock signal Clk1 such that comparisons are triggered on the rising edge of clock signal Clk1 and the comparator outputs Q and $\overline{Q}$ are valid for at least the duration of clock signal Clk1. In one embodiment, voltage $V_{Ref1}$ is the logical threshold level of the inverter gate in the comparator.

The output signal digital_out from comparator 120 is a single bit digital data stream on terminal 121 which data stream is provided to digital processing circuitry 134 for filtering and determining the digital value thereof. In the present embodiment, the digital_out signal has an ones density that is proportional to the average amplitude of the input voltage step Vin due to the switched current excitation over the time period examined.

In modulation system 100, the analog output signal from the integrator 101 is taken directly from the accumulation capacitor Caccum, which is continuously connected, without any series switches, to integrator output node 114. In conventional modulation systems, the output signal is typically taken from the output terminal of the amplifier. While the accumulation capacitor Caccum is disconnected from amplifier 112 by the action of opening switch S3, capacitor Caccum remains connected to the output node 114 and the analog output signal integ_out remains valid. The integ_out signal can be used by the subsequent analog stages even during the time interval when the integrator amplifier is shorted input-to-output through switch S2 for correlated double sampling. Using the valid signal during the correlated double sampling time can reduce the number of clock phases required for the modulation system operation and make possible the pipelined implementation of buffer 118 or comparator 120.

The present configuration of modulation system 100 provides another advantage. As is well known in the art, switching of any capacitor can generate error charge due to digital switch signal charge feed-through or kT/C noise generation at the switches. Any error charge which collects at the accumulation capacitor will reduce the accuracy of the analog to digital conversion. In the present configuration, because the output signal is taken from a point within the feedback loop of the amplifier, charge error generated as a result of switching capacitor Caccum by switch S3 is reduced. The error reduction is due to the fact that any switch S3 induced charge error is split between the amplifier output and capacitor Caccum. The closed loop amplifier topology present during this switching time insures that the majority of the error charge flows to the amplifier output, where it is dissipated. This is especially effective for reducing the accumulated error due to the kT/C noise event when switch S3 is opened.

In accordance with the present invention, modulation system 100 implements data dependant charge accumulation. That is, charge packets are continuously generated at charge packet circuit 108 but the modulation system determines whether to accumulate the charges at capacitor Caccum in a data dependent manner. Specifically, the inverse of the digital_out signal, on terminal 122, is coupled to a logic circuit 123 which generates the data dependent Data_dep signal (on node 130) and its inverse Data_dep_bar (on node 132). Data_dep signal is coupled to control switch S2 and Data_dep_bar signal is coupled to control switch S3 of integrator 101. In this manner, integrator 101 is activated or deactivated based on the data dependent signal and its inverse. As a result, the reference charge packet is accumulated or ignored by the action of switches S2 and S3.

Logic circuit 123 is controlled by a clock signal Clk4 and is activated on the rising edge of clock Clk4 for generating the Data_dep and Data_dep_bar signals. Logic circuit 123 also receives a clock signal Clk2 which controls integrator 101 for performing correlated double sampling, as will be described in more detail below. In the present embodiment, logic circuit 123 includes an AND logic gate 124 receiving the inverse of the digital_out signal and clock Clk4. The output of the AND gate is coupled to an OR logic gate 126 which also receives clock Clk2 as input. The output of OR gate 126 is the Data_dep signal. An inverter 128 is used to generate the inverse signal Data_dep_bar. Note that FIG. 1 merely illustrates one embodiment of logic circuit 123 and one of ordinary skill in the art would appreciate that logic circuit 123 can be implemented in other manners using other combination of logic gates to generate the same data dependent signals.

In operation, during the charge balancing phase, when the charge accumulated in Caccum is negative, the voltage integ_out at the output node 114 of integrator 101 becomes a positive voltage, the voltage integ_out_neg thus becomes negative and comparator 120 generates a logical low value ("0") as digital_out. The inverse of digital_out on line 122 is thus a logical high value. Accordingly, Data_dep signal on node 130 is asserted and switch S2 is closed to short out (or deactivate) the integrator. As a result, the reference charge packet from charge packet generator circuit 108 is not accumulated and is dissipated by the amplifier output circuits. Alternately, when the charge accumulated on Caccum is positive, the voltage integ_out at the output node 114 of integrator 101 is negative, the voltage integ_out_neg is thus positive, and comparator 120 generates a logical high value ("1") as digital_out. The inverse of digital_out on line 122 is thus a logical low value. Accordingly, Data_dep_bar signal on node 132 is asserted and switch S3 is closed to activate the integrator. The reference charge packet from charge packet circuit is thus accumulated at capacitor Caccum. In this manner, modulation system 100 accumulates the charge from the reference charge packet in a data dependent manner.

As mentioned above, modulation system 100 of the present invention employs correlated double sampling (CDS) to cancel the amplifier DC offset voltage, 1/f noise and wideband amplifier noise. Specifically, during the CDS phase activated by clock signal Clk2, integrator 101 is shorted out and capacitor Caccum is disconnected from the amplifier. Any offset voltage, input 1/f noise and wideband voltage noise, collectively referred to as "the amplifier error voltage", at the input terminals of amplifier 112 also appear at the output terminal (node 116) of amplifier 112. Due to the short-circuited connection at amplifier 112, the voltage at the right plate of capacitor Cin is thus charged to the amplifier error voltage. In this manner, the amplifier error voltage is stored on capacitor Cin and is cancelled out at amplifier 112 during the subsequent input acquisition phase. Thus, a highly precise output voltage can be generated at amplifier 112, free of offset errors and amplifier noise.

In the present embodiment, CDS is implemented without the use of switched capacitors at the analog input terminal of the modulation system. In the conventional systems, switched capacitors are typically used at the modulator analog input terminal and introduce several disadvantages. For example, the use of switched capacitors typically causes wideband kT/C noise to be sampled at the input to the modulation system. Furthermore, the use of switched capacitors at the analog input terminal can cause current spikes to be pulled from the analog input source which current spikes can cause accuracy problems. Specifically, the current spikes can result in ringing on the sampled waveform and thereby introduces uncertainties into the sampled input signal. By avoiding the use of switched input capacitors, the modulation system of the present invention avoids the above deficiencies.

The modulation system of the present invention combines the functionality of the sensor excitation, signal conditioning, and AC coupling within the circuitry required for a charge balancing modulation system. When the modulation system of the present invention is incorporated in an analog-to-digital converter, the configuration of the modulation system results in an ADC that requires significantly fewer circuit components. As is well understood in the art, any noise added to the sensor output signal from the sensor excitation source, signal conditioning circuitry, AC coupling or ADC circuits will degrade the accuracy of digitized measurements. The modulation system of the present invention is implemented in a manner which eliminates many of the typical noise generating circuit elements and reduces the noise generated within the remaining ADC circuitry. As a result, a very low noise modulation system or a low noise ADC can be implemented.

As mentioned above, the modulation system of the present invention can be incorporated in a delta-sigma ADC or an incremental ADC. A complete delta-sigma ADC includes a charge balancing modulator and digital post processing circuitry. The digital post processing circuitry implements digital filtering of the modulator output data stream. An incremental ADC can be made from the same charge balancing modulator with the addition of a means to initialize the modulator and remove the accumulated history of past analog input signals before the start of each new conversion. For a first order converter, the initialization function is implemented by a single reset switch or for higher order systems by reset switches at each integrator, activated before the start of a conversion sequence. The reset switch(es) short out and thus remove the charge accumulated in the integrator(s) within the modulator during the past conversions. The digital post processing circuitry within an incremental ADC also contains a means to initialize the circuit and remove all past history before the start of each conversion. In an incremental ADC, the digital post processing circuitry used to process the digital data stream to a single multiple bit output value is often implemented using one or more set-able counters whose count is set to a known value before each conversion. For a detailed description of incremental ADCs and delta-sigma ADCs, refer to J. Robert, G. Temes, V. Valencic, R. Dessoulavy and P. Deval, "A 16-bit Low-Voltage CMOS A/D Converter", IEEE Journal of Solid-State Circuits, Vol. SC-22, No. 2, April, 1987, pp. 157–163.

Referring to FIG. 1, modulation system 100 as shown implements the front end of a first order delta-sigma ADC for digitizing analog signals from input sensor 102. The addition of a single switch across capacitor Caccum, activated only before the start of each conversion, implements the front end of a first order incremental sensor digitizing ADC.

System Operation

Figure 3:
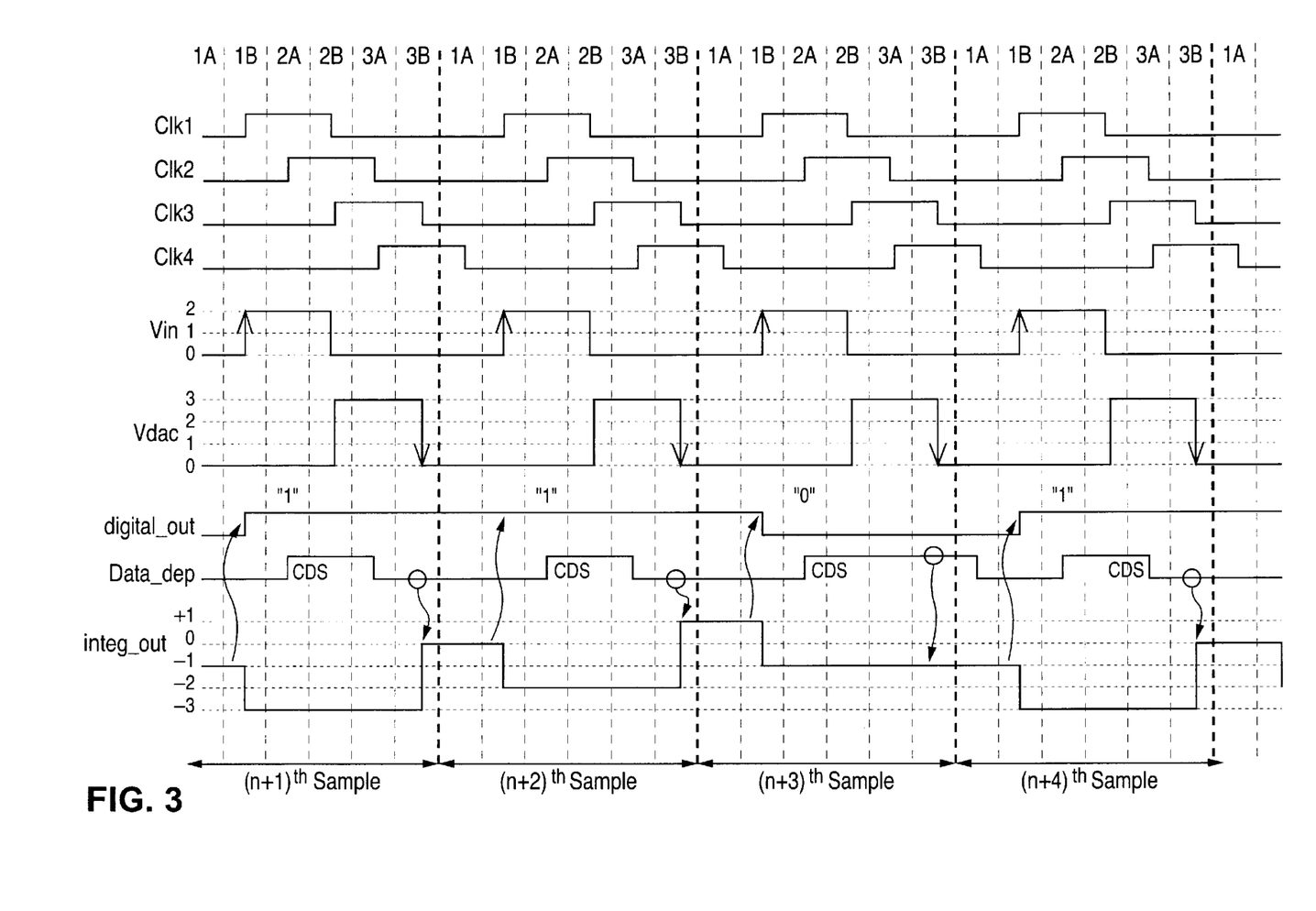
FIG. 3 illustrates one representative clocking scheme under which the modulation system of the present invention can be operated.

Having described the overall structure of the modulation system, the operation of the modulation system will now be described with reference to the timing diagram of FIG. 3. FIG. 3 illustrates one representative clocking scheme under which the modulation system of the present invention can be operated. Of course, one of ordinary skill in the art would appreciate that other clocking schemes can also be used to operate the modulation system of the present invention to achieve the desired low noise, high precision analog-to-digital conversion.

Referring to FIG. 3, the clock signal waveforms and the corresponding values for the digital_out signal, the Data_dep signal and the integ_out signal are shown for four representative samples during a conversion of the input voltage step or ΔVin. For the case where a first order incremental ADC is implemented, a single conversion to obtain q-bit digital output data requires $2^q$ samples of the input voltage step. For instance, to convert an analog value into a 16-bit digital output data will require 65,536 samples in a single conversion. In the present embodiment, it is assumed that the amplitude of the input voltage step does not change or changes very slowly during the time of a single conversion so that dynamic measurement errors can be ignored. In one embodiment of the present invention, a conversion time of 200 ms is required to obtain digital data of 16 bit precision and a conversion time of 12.5 ms is required to obtain digital data of 12 bit precision. Therefore, as long as the sensed input condition is not changing rapidly with respect to the conversion time period, the above assumption will hold.

FIG. 3 illustrates the timing and signal waveforms for the $(n+1)^{th}$ to $(n+4)^{th}$ samples of a conversion using modulation system 100 of the present invention. The initialization of modulation system 100 and the initial conditions of the various nodes of the system are not shown in FIG. 3. In one embodiment, when modulation system 100 is used to implement an incremental ADC, a switch is coupled across capacitor Caccum to short out capacitor Caccum before each conversion to remove any charge stored thereon. However, the shorting of capacitor Caccum in an incremental ADC implementation between conversions is optional as any residual charge on the capacitor will only result in small measurement errors. In a delta sigma ADC application the capacitor Caccum is never shorted out between conversions, as it is required to hold a residue charge from past conversion cycles.

Each sampling cycle of modulation system 100 can be viewed as consisting of three phases: an input sampling and charge integration phase, a CDS phase and a data dependent charge balancing phase. Referring to FIG. 3, timing intervals 1A, 1B, 2A, 2B, 3A, and 3B are provided to denote the A and B portions of each of the three phases of the sampling cycle. Furthermore, signal integ_out as illustrated in FIG. 3 is a voltage signal used to indicate the amount of charge stored on capacitor Caccum. Capacitor Caccum is located within the negative feedback path of inverting amplifier 112. Because the inverting amplifier will force the left plate of capacitor Caccum at the inverting input terminal (node 110) to virtual ground, the integ_out voltage signal at the right plate of capacitor Caccum (or the integrator output node 114) is given as:

$$V_{\text{integ\_out}} = -\frac{Q_{accum}}{C_{accum}}.$$

In FIG. 3, the vertical scale of the integ_out signal is divided into slices demarcating separate voltage units which voltage unit is a measurement unit used in the present description to quantify the charge stored or the charge transferred in modulation system 100. The voltage units are defined solely to show the voltage change due to integration of one unit charge, where said unit charge will be used in the description of the operation of modulation system 100. The vertical scale associated with the integ_out signal does not define an absolute zero voltage reference point. However, to facilitate the description of the operation of the modulation system of the present invention, an artificial zero volt reference value for the integ_out signal can be assumed to correspond to a voltage unit level between the third voltage unit and the fifth voltage unit. Similarly, voltage steps Vin and Vdac are expressed in FIG. 3 in terms of voltage units. Voltage steps Vin and Vdac in FIG. 3 are not drawn to scale.

At the $n^{th}$ sampling cycle, modulation system 100 has generated a digital_out value of "0". At the end of the $n^{th}$ sampling cycle, capacitor Caccum has stored thereon one unit of charge as a result of the charge integration and charge balancing phases during the $n^{th}$ sampling cycle. The voltage of integ_out signal at output node 114 of inverting amplifier 112 is therefore at minus one (−1) voltage unit.

At the beginning of the $(n+1)^{th}$ sampling cycle (interval 1A), the input voltage Vin is stable at a low voltage level. Clock CLK4 is deasserted and all clock signals are at a low logical level. Switches S1 and S2 are open while switch S3 is closed as a result. Integrator 101 of modulation system 100 is therefore in an active mode and the sampling and charge integration phase has begun. Then, at interval 1B, clock Clk1 is asserted (goes high). Since clock Clk1 controls the switched excitation current circuit as well as comparator 120, two events take place at the rising edge of clock Clk1.

First, comparator 120 is interrogated and the digital_out value for the previous sample is read out. Because integ_out has a value of minus one (−1) voltage unit, inverting gain buffer 118 converts integ_out signal to integ_out_neg signal having a relatively positive voltage level (such as +K voltage units, when K=1, integ_out_neg signal is about +1 voltage unit). At comparator 120, the integ_out_neg signal is compared with reference voltage $V_{Ref1}$ which is assumed to be at zero volt in the present embodiment. Because the integ_out_neg signal is greater than $V_{Ref1}$, comparator 120 generates a logical high value as the digital_out "Q" output.

Thus, the digital_out signal switches to a logical "1" value during interval 1B in response to clock Clk1.

Second, switch S1 is closed in response to the rising edge of clock Clk1 and input sensor 102 is excited by the application of switched current I1 from current source 105. In response to the switched current excitation, input voltage Vin steps from a first voltage value to a second, higher voltage value. The change in voltage Vin (ΔVin) is AC coupled through capacitor Cin to the inverting input terminal of amplifier 112. Because it is assumed that the input voltage step persists for a long time as compared to the input circuit time constants, all the charge collected at the left plate of capacitor Cin associated with ΔVin is transferred to the right plate of capacitor Cin. Specifically, the charge coupled through capacitor Cin is given by:

$$Q_{in} = C_{in} \Delta V_{in}$$

where ΔVin is the change in input voltage Vin due to the synchronous switched current excitation and Cin is the value of capacitor Cin.

Because integrator 101 is in the active mode, amplifier 112 forces the inverting input terminal (node 110) to a virtual ground. Therefore, the charge coupled through capacitor Cin is directed to capacitor Caccum. Because amplifier 112 is configured in an inverting mode, the increase in charge stored in capacitor Caccum causes a decrease in the voltage at integ_out proportional to the magnitude of the charge Qin to be accumulated:

$$\Delta V_{\text{integ\_out}} = -\frac{\Delta Q_{accum}}{C_{accum}} = -\frac{Q_{in}}{C_{accum}} = -\Delta V_{in} \frac{C_{in}}{C_{accum}}$$

where Qaccum is the charge accumulated at capacitor Caccum, and Caccum represents the capacitance of capacitor Caccum.

In the present embodiment, capacitor Cin and capacitor Caccum have the same capacitance value. In one embodiment, the capacitance of capacitor Cin and of capacitor Caccum is 2 pF. In the present illustration, it is assumed that the rising edge of Vin causes two additional charge units to be stored in capacitor Caccum and thus the integ_out signal decreases by two voltage units to a level of minus three (−3) voltage units.

Because integrator 101 is active during the entire interval 1B, that is, the integrator is active before, during and after the Vin rising edge, continuous time integration of the input voltage step signal is realized. As described above, the use of continuous time integration to sample the input analog voltage has the effect of low pass filtering the input signal and thereby filters out any wideband noise that may present on the input signal.

After sampling and integrating the charge associated with the rising edge of input voltage Vin, the charge integration phase of the sampling cycle has completed and modulation system 100 begins performing correlated double sampling (CDS) (time intervals 2A and 2B) for the next sampling cycle. In the present timing scheme, precharging the input capacitor with the amplifier error voltage from amplifier 112 is controlled by clock Clk2 and is always performed in one sampling cycle for the next sampling cycle. Thus, during time interval 2A, clock Clk2 is asserted. As a result, OR gate 126 of logic circuit 123 generates a logical "hi" value on output node 130. Thus, Data_dep signal switches to a logical "hi" value and Data_dep_bar switches to a logical "low" value correspondingly. Accordingly, switch S2 is closed and switch S3 is open and integrator 101 is made inactive.

As a result of closing switch S2, amplifier 112 is shorted out and integrator 101 is inactive. Therefore, any amplifier error voltage, such as those due to DC offset voltage and 1/f noise, appears on the amplifier output terminal. Input capacitor Cin is thereby precharged with the amplifier error voltage so that, at the next sampling cycle, the amplifier error voltage is cancelled out during the sampling and charge integration phase. In this manner, correlated double sampling of the modulation system is effectuated.

In the present embodiment, when clock Clk2 is asserted, integrator 101 is forced to be inactive. Therefore, clock Clk2 can be used advantageously to block the sampling of undesired signal transitions. For instance, when clock Clk1 is deasserted, switch S1 is open and input voltage Vin switches back to a low voltage value. The high-to-low transition of input voltage Vin should not be accumulated by integrator 101 as the high-to-low transition will cancel out the charge previously accumulated at the low-to-high transition. Therefore, in the present timing scheme, clock Clk1 is deasserted during the active cycle of clock Clk2 (interval 2B). Thus, the falling edge of input voltage step Vin is ignored by modulation system 100 and no charge from the Vin falling edge is accumulated.

Furthermore, to implement charge balancing in modulation system 100, a negative charge packet is applied to integrator 101 at each sampling cycle to balance out the positive charge accumulated from the ΔVin voltage. In FIG. 3, voltage waveform Vdac represents the voltage used to generate the reference charge packet. For example, voltage Vdac can be the voltage Vdac 454 in the charge packet generator circuit of FIG. 2. In the present embodiment, to effectuate charge balancing, only the negative charge packet associated with the falling edge of voltage Vdac is used. Thus, in accordance with the present timing scheme, the positive-going transition of voltage Vdac is applied during the active cycle of clock Clk2 while integrator 101 is deactivated so that the positive charge packet associated with the rising edge of voltage Vdac is ignored. In modulation system 100, clock Clk3 controls charge packet generator circuit 108 for generating a charge packet on node 110. Thus, voltage Vdac is synchronous with clock Clk3. Referring to FIG. 3, clock Clk3 is asserted during the active cycle of clock Clk2 (interval 2B) such that the rising edge of voltage Vdac (the positive charge packet) occurs during the integrator inactive period.

As a result of deasserting clock Clk1 and asserting clock Clk3 during the active period of clock Clk2 (interval 2B), the accumulated charge on capacitor Caccum due to the rising edge of input voltage Vin is preserved and the charge associated with the rising edge of voltage Vdac is ignored. The modulation system is now ready to begin the data dependent charge balancing phase.

During interval 3A, clock Clk2 is deasserted while clock Clk4 is asserted. Thus, integrator 101 is no longer forced in the inactive mode but instead the integrator is either active or inactive depending upon the value of the digital_out signal and consequently the Data_dep signal. The assertion of clock Clk4 activates the data dependent charge balancing phase of the sampling cycle. During the charge balancing phase, the modulation system determines in a data dependent manner whether to accumulate or disregard the negative reference charge packet to be generated by the falling edge of voltage Vdac.

AND gate 124 of logic circuit 123 receives as input signals clock Clk4 and the inverse of the digital_out signal (Q). When clock Clk4 is asserted, the output of AND gate 124 will have the same value as the inverse of the digital_ out signal ($\overline{Q}$). The output of OR gate 126 is also the same as the output of AND gate 124 as the other input of OR gate 126 (clock CLK2) is deasserted. Thus, logic circuit 123 generates a Data_dep signal which is the inverse of the digital_out signal. In the present illustration, digital_out has a value of "1" and thus Data_dep transitions to a low logical value when clock Clk4 is asserted.

When Data_dep has a logical value of "0", switch S2 is open and switch S3, controlled by Data_dep_bar, is closed. Thus, integrator 101 is activated. During interval 3B, clock Clk3 is deasserted and voltage Vdac makes a high-to-low transition. The negative charge associated with the falling edge of voltage Vdac is thus accumulated by integrator 101. As shown in FIG. 3, the integ_out value increases by three voltage units, from −3 to 0, as a result of accumulating the negative reference charge packet (the reference charge packet is assumed to be of minus three (−3) charge units). Note that because integrator 101 is activated during intervals 3A and 3B, that is before, during and after the falling edge of the reference charge packet, the integrator implements continuous time integration which effectuates a low-pass filter function for filtering any wideband noise on the reference charge packet signal.

At the end of the charge balancing phase, capacitor Caccum has accumulated charged based on the change in input voltage ΔVin and based on the reference charge packet, in a data dependent manner. During the $(n+1)^{th}$ sampling cycle the accumulated charge has increased by two units and decreased by three, resulting in a held charge of zero charge units at capacitor Caccum and a voltage at integ_out of zero voltage units. The modulation system then proceeds to the next sampling cycle by deasserting clock CLK4 and asserting clock Clk1.

During the $(n+2)^{th}$ sampling cycle, modulation system operates in the same manner as described above. When the charge associated with the positive step ΔVin voltage, having two charge units, is accumulated, the charge at capacitor Caccum increases by 2 charge units and the voltage at integ_out (node 114) decreases to −2 voltage units. Because comparator 120 continues to read an integ_out_neg value that is greater than $V_{Ref1}$, digital_out remains at a logical "1" value. Thus, during the data dependent charge balancing phase, the negative reference charge packet is accumulated by capacitor Caccum and Qaccum decreases by three charge units, with a corresponding increase in the voltage at integ_out of 3 voltage units. A sum of negative one charge units is stored on capacitor Caccum at the end of the $(n+2)^{th}$ sampling cycle, and the voltage at integ_out is at plus one (+1) voltage units.

At the $(n+3)^{th}$ sampling cycle, integ_out signal has a voltage level that exceeds the artificial zero volt reference level. Thus, the integ_out_neg signal becomes a negative voltage value or a voltage value less than $V_{Ref1}$. Thus, comparator 120 generates a logical "0" as output and digital_out transitions to a logical "0" value as shown in FIG. 3. When the ΔVin voltage, having two positive charge units, is accumulated, the charge at capacitor Caccum changes from negative 1 to positive 1 charge units and integ_out signal decreases to minus one voltage units.

As a result of digital_out being at a logical "0" value, the Data_dep signal remains at a logical "1" value when the charge balancing phase (interval 3A) is initiated. The state of the Data_dep signal causes switch S2 to close and switch S3 to open. Thus, integrator 101 is deactivated and capacitor Caccum is prevented from accumulating any charge from the falling edge of the reference charge packet (interval 3B). Integ_out thus remains at the minus one voltage unit level at the end of the $(n+3)^{th}$ sampling cycle.

As shown by the operation of sampling cycles n+1 to n+3, modulation system 100 implements data dependent charge balancing and the charge associated with the falling edge of voltage Vdac, which is used to generate the reference charge packet, is either accumulated or ignored depending on the value of the digital_out signal.

In sum, in the present embodiment, modulation system 100 implements charge balancing by sampling only the rising edge of the input voltage step Vin and accumulating, in a data dependent manner, only the reference charge packets generated by the falling edge of voltage Vdac. Because integrator 101 is an inverting integrator, the integ_out signal decreases due to the rising edge of Vin and increases due to the negative reference charge packet.

As a result of adding and subtracting the charge due to the ΔVin voltage and the charge from the reference charge packet, the modulation system generates a digital_out signal in the form of a ones density data stream. The single bit output data stream generated by comparator 120 will exhibit a ones density proportional to the amplitude of the change in input voltage ΔVin. Specifically, under the assumption that the step size ΔVin does not change appreciably over a single conversion, the average ones density is given as:

$$OnesDensity = \Delta V_{in} \frac{C_{in}}{C_{ref} V_{ref}} = \frac{Q_{in}}{Q_{ref}},$$

where Qref denotes the amount of charge in the reference charge packet. The ones density value is always less than or equal to 1 as Qin is always less than or equal to Qref. For example, in the present illustration, the ΔVin voltage step generates an input charge Qin that has a charge unit level that is ⅔ of the reference charge packet Qref. Thus, a ones density data stream containing 66.7% ones and 33.3% zeroes is generated. After completing a conversion of the input voltage value, the ones density pulse stream can be processed by the subsequent digital processing circuitry to determine the digital value thereof.

Alternate Embodiments

In the above descriptions, amplifier 112 is implemented as an operational amplifier where the non-inverting input terminal is connected to the ground potential. In an alternate embodiment, the amplifier can be implemented as a two terminal self-referential inverting transconductance amplifier (referred to herein as a gmIC). An amplifier capable of operating at very low voltage levels with uncompromised or even improved performances in transconductance is described in commonly assigned U.S. Pat. No. 6,147,550, entitled "Method And Apparatus For Reliably Determining Subthreshold Current Densities In Transconductance Cells," of Peter R. Holloway, issued Nov. 14, 2000; and also in commonly assigned U.S. Pat. No. 5,936,433, entitled "Comparator Including A Transconducting Inverter Biased To Operate In Subthreshold," of Peter R. Holloway, issued Aug. 10, 1999. Both of the aforementioned patents are incorporated herein by reference in their entireties. Thus, in the alternate embodiment, amplifier 112 is implemented based on the transconductance inverting cell technology described in the aforementioned patents and amplifier 112 is self-referencing. Therefore, amplifier 112 includes only one input terminal coupled to node 110 and no reference voltage input terminal is needed.

Furthermore, in an alternate embodiment, buffer 118 and comparator 120 can each be implemented as a transconductance amplifier (gmIC) described above. Because a gmIC is a self-referential amplifier, comparator 120 will not require a separate reference voltage.

Switches S2 and S3 in modulation system 100 are composed of MOS transistors and are typically controlled by non-overlapping digital signals. When any MOS switch is turned from on to off, its stored channel charge will be shared by the capacitors and circuit elements connected to both its analog input and its analog output terminals. This charge sharing condition is often referred to as charge feed-through. This channel charge is an additive error because it does not originate from the input analog signals but is generated from within the switches when they are switched off.

The switches in modulation system 100 can be implemented using any conventional switch circuits. According to another aspect of the present invention, switches S2 and S3 of modulation system 100 are implemented as "boosted" switches to reduce charge feed-through that may occur when the switches are being turned on or off. A self-bootstrapping constant on-resistance "bootsted" switch circuit is described in copending and commonly assigned U.S. patent application Ser. No. 10/402,080, entitled "A Constant RON Switch Circuit with Low Distortion and Reduction of Pedestal Errors," of Peter R. Holloway, filed Mar. 27, 2003, which patent application is incorporated herein by reference in its entirety. When the low distortion switch circuit described in the aforementioned patent application is used to implement switches S2 and S3, errors resulting from channel charge feed-through during the switching of the switches are significantly reduced.

Furthermore, according to another aspect of the present invention, switch S2 and switch S3 are scaled to ensure that the net charge error accumulated in capacitor Caccum during each sampling cycle is nearly zero. Specifically, because switch S2 and switch S3 are connected to different nodes within the modulator circuit, the feed-through charge error generated by equally-sized switches does not result in a zero net charge error across capacitor Caccum. It is known that the channel charge error generated within a switch is proportional to its gate area. By scaling the ratio of the gate areas of switches S2 and S3 appropriately, the amount of charge error can be applied to both sides of capacitor Caccum, first by one switch and then by the other, which results in a net charge error of nearly zero being held in capacitor Caccum at the end of each sampling cycle.

As mentioned above, the timing scheme shown in FIG. 3 for operating modulation system 100 is illustrative only. One of ordinary skill in the art would appreciate that modifications to the clocking schemes and the clock duration can be made to operate the modulation system of the present invention in the input sampling and charge integration phase, the CDS phase and the charge balancing phase. The length of time assigned to each interval can be varied such as to accommodate the settling time required in each operational interval. Furthermore, in the timing scheme shown in FIG. 3, modulation system 100 operates to sample the rising edge of the input voltage step Vin and the falling edge of the voltage Vdac generating a negative reference charge packet. However, in other embodiments, modulation system 100 can be operated to sampling the falling edge of the input voltage step Vin and the rising edge of the voltage Vdac generating a positive reference charge packet.

Also, in the timing scheme illustrated in FIG. 3, the comparator is interrogated during the sampling and charge integration phase of the sampling cycle. Thus, the comparator is interrogated at the same time that the input sensor is being excited, the step input voltage is being sampled and the charge associated with the step input voltage Vin is being integrated. In other embodiments, the comparator can be interrogated at other phases of the sampling cycle. For example, the comparator can be driven by clock CLK2 or CLK3 instead so that the comparator is asserted during the CDS phase of the sampling cycle.

In the above description, a modulation system incorporating a synchronous excitation source and a modulator is used to sample and digitize analog input signals generated by a sensor. According to another aspect of the present invention, the modulator of the modulation system of the present invention can be operated as a stand alone modulator receiving analog input signals from an excitation source driving a sensor where the excitation source is not integrated with the modulator to operate as a single synchronous unit. In that case, the excitation source can be synchronized with the modulator using known synchronization schemes. For example, clocks driving the excitation source can be synchronized with clocks driving the modulator using a phase lock loop. Thus, the embodiment of modulation system 100 shown in FIG. 1 is illustrative only and is not intended to limit the use of the modulation system as an integrated unit including an excitation source and a modulator. The modulator of the modulation system can be adapted to operate with an external excitation source as long as synchronous detection is implemented.

Applications

The modulation system of the present invention can be applied to sample and digitize the analog signal generated at an impedance varying sensor. For instance, the modulation system can be used to make temperature, resistance, pressure or displacement measurements by providing the appropriate input sensor elements.

Figure 4:
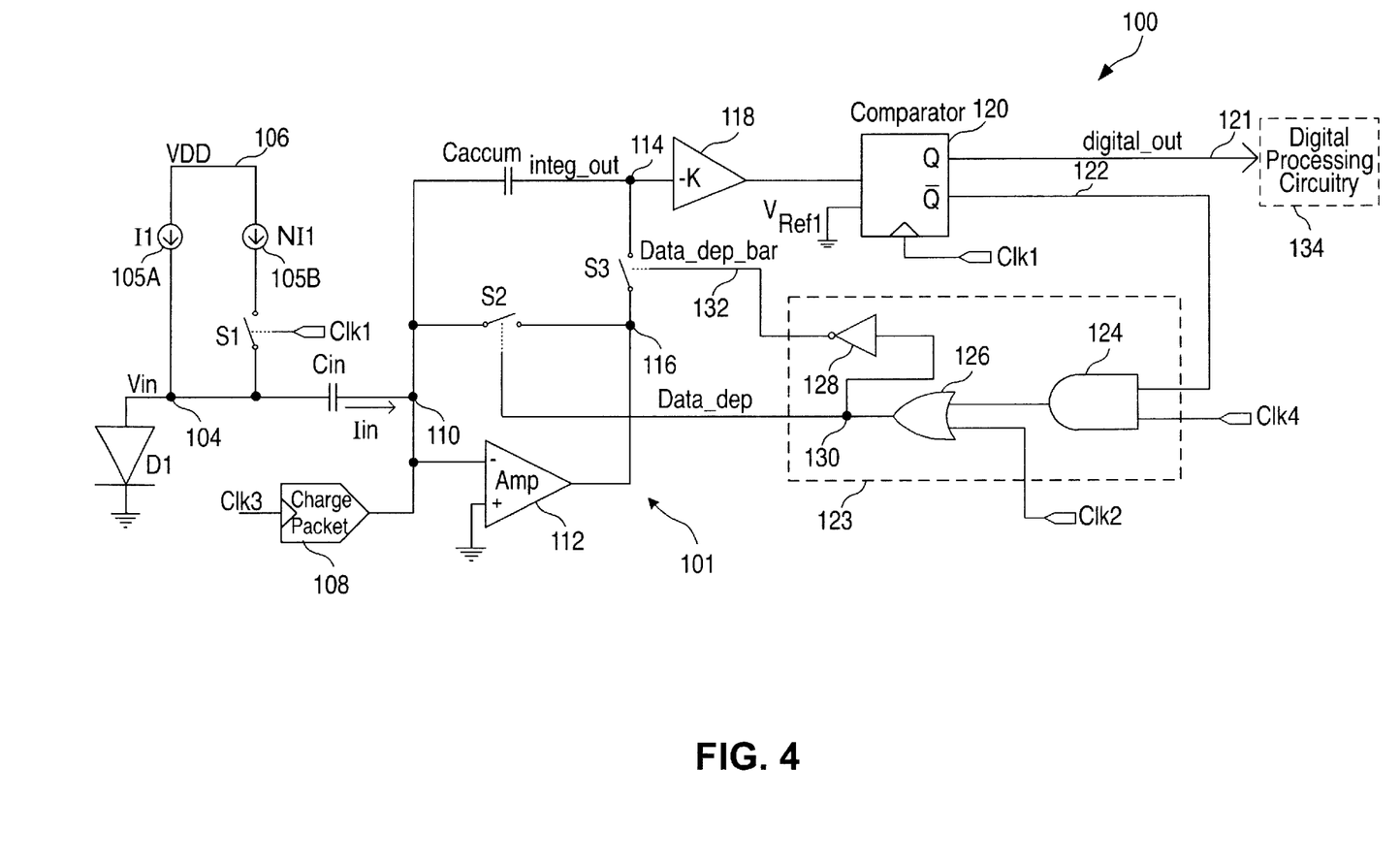
FIG. 4 illustrates an alternate embodiment of the present invention where the modulation system of FIG. 1 is adapted for temperature measurement.

FIG. 4 illustrates an alternate embodiment of the present invention where modulation system 100 is adapted for temperature measurement. Referring to FIG. 4, for the purpose of temperature sensing, the input sensor element is typically implemented as a diode or diode-connected bipolar transistor, illustrated as diode D1. As is well known in the art, to measure temperature of the substrate on which diode D1 is built, two currents with a known ratio are applied to the temperature sensing diode and the voltages generated by the diode at the two different current levels are measured to compute a $\Delta V_{BE}$ voltage which is proportional to temperature.

In the configuration in FIG. 4, diode D1 is excited by the switched current circuit including two currents having a known ratio. Switch S1 is used to switchably connect current source 105B having current N*I1 to diode D1 while current source 105A remains connected to diode D1. Thus, diode D1 is excited by a current of I1 and a current of (N+1)I1 based on the switching of the switched current circuit.

When the reference charge packet is appropriately compensated against changing external conditions, such as temperature or supply voltage variations, and the input voltage step ΔVbe is assumed not to change appreciably over the measurement time, the modulation system 100 implements the following transfer function:

$$OnesDensity = \Delta V_{be} \frac{C_{in}}{C_{ref} V_{ref}}.$$

As ΔVbe exhibits a known linear increase with temperature, the resulting ones density is proportional to the temperature at the sensing diode D1. Then, digital post processing can be applied to accumulate a sum of the ones over a given conversion time interval, which sum is linearly proportional to the diode temperature.

In other embodiments of the present invention, the modulation system can be adapted to measure resistance. The input sensor can be a resistor whose resistance varies with applied pressure or ambient temperature or other parameter of interest, such as distance. The resistor can be excited by the switched current circuit to generate a voltage change corresponding to the resistance value.

The above detailed descriptions are provided to illustrate specific embodiments of the present invention and are not intended to be limiting. Numerous modifications and variations within the scope of the present invention are possible. The present invention is defined by the appended claims.

We claim:

1. A modulation system generating and receiving an analog input signal from an input sensor, said modulation system comprising:

a switched excitation circuit coupled to excite said input sensor for generating an input voltage step;

an integrator receiving said input voltage step through AC coupling, said integrator integrating charge associated with said input voltage step in synchronous with the excitation of said input sensor, said integrator balancing said charge with a reference charge packet in accordance with a data dependent signal, and said integrator generating an integrator output signal; and a comparator having an input terminal coupled to receive a signal corresponding to said integrator output signal and comparing said integrator output signal to a reference level to generate a digital output signal at an output terminal, said data dependent signal having a value corresponding to said digital output signal, wherein said digital output signal forms a digital data stream over a plurality of sampling cycles, said digital data stream having a ones density proportional to a magnitude of said input voltage step.

2. The modulation system of claim 1, wherein said integrator comprises an input capacitor coupled to an amplifier, such that when said integrator is operated in a correlated double sampling mode, said amplifier is shorted out to store an amplifier error voltage onto said input capacitor.

3. The modulation system of claim 1, wherein said comparator further comprises a second input terminal coupled to receive a reference voltage as said reference level.

4. The modulation system of claim 1, wherein said comparator comprises a self-referential transconductance amplifier including one or more transconducting inverters.

5. The modulation system of claim 1, wherein said reference charge packet is generated based on a first voltage, said integrator integrates charges associated with a rising edge of said input voltage step, and said data dependent signal directing said integrator to either integrate said reference charge packet associated with a falling edge of said first voltage or disregard said reference charge packet.

6. The modulation system of claim 1, wherein said reference charge packet is generated based on a first voltage, said integrator integrates charges associated with a falling edge of said input voltage step, and said data dependent signal directing said integrator to either integrate said reference charge packet associated with a rising edge of said first voltage or disregard said reference charge packet.

7. A modulation system generating and receiving an analog input signal from an input sensor, said modulation system comprising:

a switched excitation circuit coupled to excite said input sensor for generating an input voltage step;

an integrator coupled to sample said input voltage step in synchronous with the excitation of said input sensor and to generate an integrator output signal, said integrator comprising:

an input capacitor having a first terminal coupled to said input sensor and a second terminal;

an amplifier having a first input terminal coupled to said second terminal of said input capacitor and an output terminal;

an accumulation capacitor having a first terminal coupled to said first input terminal of said amplifier and a second terminal providing said integrator output signal;

a first switch coupled between said first input terminal and said output terminal of said amplifier, said first switch being controlled by a data dependent signal;

a second switch coupled between said second terminal of said accumulation capacitor and said output terminal of said amplifier, said second switch being controlled by an inverse of said data dependent signal; and a charge packet generator circuit generating a reference charge packet based on a first voltage and coupling the reference charge packet to said first input terminal of said amplifier; and a comparator having an input terminal coupled to receive a signal corresponding to said integrator output signal and comparing said integrator output signal to a reference level to generate an output signal at an output terminal, said data dependent signal having a value corresponding to said output signal of said comparator, wherein said output signal forms a digital data stream over a plurality of sampling cycles, said digital data stream having a ones density proportional to a magnitude of said input voltage step.

8. The modulation system of claim 7, wherein said first switch is closed and said second switch is open to operate said integrator in a correlated double sampling mode for enabling said amplifier to store an amplifier error voltage onto said input capacitor.

9. The modulation system of claim 8, wherein said amplifier error voltage comprises an amplifier offset voltage, 1/f noise and wideband amplifier noise.

10. The modulation system of claim 8, further comprising:

a logic circuit for generating said data dependent signal and said inverse, said logic circuit receiving an input signal corresponding to said output signal and a first clock signal, wherein said first clock signal is asserted to cause said data dependent signal to be at a first value for operating said integrator in said correlated double sampling mode.

11. The modulation system of claim 7, wherein said input voltage step is AC coupled through said input capacitor and a charge packet corresponding to the magnitude of said input voltage step is stored on said accumulation capacitor in said integrator.

12. The modulation system of claim 7, wherein said integrator further comprises an inverting buffer having an input terminal coupled to said second terminal of said accumulation capacitor and an output terminal coupled to said input terminal of said comparator, said comparator receiving an input signal being an inverse of said integrator output signal.

13. The modulation system of claim 12, wherein said inverting buffer comprises a self-referential transconductance amplifier.

14. The modulation system of claim 7, wherein said amplifier comprises an operational amplifier having an inverting input terminal being said first input terminal, an non-inverting input terminal coupled to a ground potential and an output terminal being said output terminal of said amplifier.

15. The modulation system of claim 7, wherein said amplifier comprises a self-referential transconductance amplifier.

16. The modulation system of claim 7, wherein said comparator further comprises a second input terminal coupled to receive a reference voltage as said reference level.

17. The modulation system of claim 7, wherein said comparator comprises a self-referential transconductance amplifier including one or more transconducting inverters.

18. The modulation system of claim 7, wherein each of said first switch and said second switch comprises a self-bootstrapping constant on-resistance switch circuit.

19. The modulation system of claim 7, wherein said switched excitation circuit and said comparator are controlled by a second clock, said second clock being asserted to excite said input sensor to generate said input voltage step which is sampled by said integrator, and said second clock also being asserted to activate said comparator for generating said output signal.

20. The modulation system of claim 7, wherein said switched excitation circuit and said comparator are controlled by a second clock, said second clock signal being asserted to excite said input sensor to cause said integrator to integrate charges associated with a rising edge of said input voltage step, and said second clock also being asserted to activate said comparator for generating said output signal.

21. The modulation system of claim 20, wherein said data dependent signal is generated in response to a third clock signal, said data dependent signal directing said integrator to either integrate said reference charge packet associated with a falling edge of said first voltage or disregard said reference charge packet.

22. The modulation system of claim 21, wherein said data dependent signal has a logical value that is an inverse of said output signal.

23. The modulation system of claim 7, wherein said switched excitation circuit and said comparator are controlled by a second clock, said second clock signal being asserted to excite said input sensor to cause said integrator to integrate charges associated with a falling edge of said input voltage step, and said second clock also being asserted to activate said comparator for generating said output signal.

24. The modulation system of claim 23, wherein said data dependent signal is generated in response to a third clock signal, said data dependent signal directing said integrator to either integrate said reference charge packet associated with a rising edge of said first voltage or disregard said reference charge packet.

25. The modulation system of claim 7, wherein said switched excitation circuit comprises a switched current circuit.

26. The modulation system of claim 7, wherein said switched excitation circuit comprises a switched voltage circuit.

27. A modulator receiving an input voltage step from an input sensor, said modulator comprising:
  an integrator coupled to sample said input voltage step in synchronous with the excitation of said input sensor and to generate an integrator output signal, said integrator comprising:
    an input capacitor having a first terminal coupled to said input sensor and a second terminal;
    an amplifier having a first input terminal coupled to said second terminal of said input capacitor and an output terminal;
    an accumulation capacitor having a first terminal coupled to said first input terminal of said amplifier and a second terminal providing said integrator output signal;
    a first switch coupled between said first input terminal and said output terminal of said amplifier, said first switch being controlled by a data dependent signal;
    a second switch coupled between said second terminal of said accumulation capacitor and said output terminal of said amplifier, said second switch being controlled by an inverse of said data dependent signal; and
    a charge packet generator circuit generating a reference charge packet based on a first voltage and coupling the reference charge packet to said first input terminal of said amplifier; and
  a comparator having an input terminal coupled to receive a signal corresponding to said integrator output signal, said comparator comparing said integrator output signal to a reference level to generate an output signal at an output terminal, said data dependent signal having a value corresponding to said output signal of said comparator,
  wherein said output signal forms a digital data stream over a plurality of sampling cycles, said digital data stream having an ones density proportional to a magnitude of said input voltage step.

28. The modulation system of claim 27, wherein said first switch is closed and said second switch is open to operate said integrator in a correlated double sampling mode for enabling said amplifier to store an amplifier error voltage onto said input capacitor.

29. The modulation system of claim 28, further comprising:
  a logic circuit for generating said data dependent signal and said inverse, said logic circuit receiving an input signal corresponding to said output signal and a first clock signal,
  wherein said first clock signal is asserted to cause said data dependent signal to be at a first value for operating said integrator in said correlated double sampling mode.

30. The modulation system of claim 27, wherein said comparator is controlled by a second clock, said second clock signal being asserted to cause said integrator to integrate charges associated with a rising edge of said input voltage step, and said second clock also being asserted to activate said comparator for generating said output signal.

31. The modulation system of claim 30, wherein said data dependent signal is generated in response to a third clock signal, said data dependent signal directing said integrator to either integrate said reference charge packet associated with a falling edge of said first voltage or disregard said reference charge packet.

32. The modulation system of claim 27, wherein said comparator is controlled by a second clock, said second clock signal being asserted to cause said integrator to integrate charges associated with a falling edge of said input voltage step, and said second clock also being asserted to activate said comparator for generating said output signal.

33. The modulation system of claim 30, wherein said data dependent signal is generated in response to a third clock signal, said data dependent signal directing said integrator to either integrate said reference charge packet associated with a rising edge of said first voltage or disregard said reference charge packet.

34. The modulation system of claim 27, wherein said amplifier comprises an operational amplifier having an inverting input terminal being said first input terminal, an non-inverting input terminal coupled to a ground potential and an output terminal being said output terminal of said amplifier.

35. The modulation system of claim 27, wherein said amplifier comprises a self-referential transconductance amplifier.

36. The modulation system of claim 27, wherein said comparator further comprises a second input terminal coupled to receive a reference voltage as said reference level.

37. The modulation system of claim 27, wherein said comparator comprises a self-referential transconductance amplifier including one or more transconducting inverters.

38. A method for sampling and digitizing an analog input data source from an input sensor, comprising:
- applying a switched excitation source to said input sensor;
- generating an input voltage step at said input sensor as a result of said application of said switched excitation source;
- AC coupling said input voltage step to an integrator;
- integrating charges corresponding to a transition of said input voltage step on an accumulation capacitor;
- applying to said integrator a reference charge packet based on a first voltage;
- generating a data dependent signal for deactivating or activating said integrator;
- integrating said reference charge packet corresponding to a transition of said first voltage when said data dependent signal has a first value or disregarding said reference charge packet when said data dependent signal has a second value, said transition of said first voltage being opposite to said transition of said input voltage step;
- comparing a signal corresponding to said charges accumulated on said accumulation capacitor with a reference voltage level; and
- generating an output signal as a result of said comparing, said data dependent signal having said first value and said second value corresponding to respective logical levels of said output signal;

wherein after a plurality of sampling cycles, said output signal forms a digital data stream having an ones density proportional to a magnitude of said input voltage step.

39. The method of claim 38, further comprising:
- in response to a first clock signal, deactivating said integrator and operating said integrator in a correlated double sampling mode, said deactivating and operating comprising:
  - shorting out an amplifier in said integrator; and
  - storing an amplifier error voltage onto an input capacitor of said integrator, said amplifier error voltage comprising an amplifier offset voltage, 1/f noise and wideband amplifier noise.

40. The method of claim 38, wherein said comparing comprises:
- coupling an inverting buffer to said accumulation capacitor;
- generating at said inverting buffer a voltage corresponding to an inverted voltage value corresponding to said charges accumulated on said accumulation capacitor; and
- comparing said voltage at said inverting buffer with said reference voltage level.

41. The method of claim 38, wherein said AC coupling said input voltage step to an integrator comprises:
- coupling said input voltage step to a first terminal of an input capacitor of said integrator;
- coupling a second terminal of said input capacitor to an input terminal of an amplifier and a first terminal of said accumulation capacitor, said accumulation capacitor being coupled between said input terminal and an output terminal of said amplifier.

42. The method of claim 38, wherein said transition of said input voltage step comprises a rising edge of said input voltage step and said transition of said first voltage comprises a falling edge of said first voltage.

43. The method of claim 38, wherein said transition of said input voltage step comprises a falling edge of said input voltage step and said transition of said first voltage comprises a rising edge of said first voltage.

* * * * *